US006303397B1

(12) United States Patent
Chen et al.

(10) Patent No.: US 6,303,397 B1
(45) Date of Patent: Oct. 16, 2001

(54) METHOD FOR BENCHMARKING THIN FILM MEASUREMENT TOOLS

(75) Inventors: Yuanning Chen; Linette Lozada; Yi Ma; Roger Morgan Young, all of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/466,285

(22) Filed: Dec. 17, 1999

Related U.S. Application Data

(60) Provisional application No. 60/128,937, filed on Apr. 13, 1999.

(51) Int. Cl.[7] .................................................. H01L 21/66
(52) U.S. Cl. ............................................. 438/14; 436/16
(58) Field of Search .................... 438/16, 14; 250/252.1, 250/492.1, 492.2; 73/1.01; 427/8, 9, 10

(56) References Cited

U.S. PATENT DOCUMENTS 5,900,939 * 5/1999 Aspnes et al. .
6,146,541 * 11/2000 Goldstein et al. .

FOREIGN PATENT DOCUMENTS 5-275410-A * 10/1993 (JP) .

* cited by examiner

Primary Examiner—Charles Bowers
Assistant Examiner—Evan Pert
(74) Attorney, Agent, or Firm—Allen, Dyer, Doppelt, Milbrath & Gilchrist, P.A.

(57) ABSTRACT

A method for calibrating thin film measurement tools includes the steps of forming an insulation layer on a semiconductor substrate, and measuring a thickness of the insulation layer using a first measurement tool. The insulation layer is exposed to an ambient environment causing a contamination layer to form thereon. At least a portion of the contamination layer is removed by heating the semiconductor substrate, and the thickness of the insulation layer and the contamination layer is measured after being heated using a second measurement tool. The first and second measurement tools are at respective widely spaced geographic locations. The steps of heating and measuring are repeated until a measurement is obtained indicating that the contamination level has been removed. The measured value of the thickness of the insulation layer using the second measurement tool is then compared to the measured value of the thickness of the insulation layer using the first measurement tool to benchmark the first and second measurement tools.

29 Claims, 3 Drawing Sheets

METHOD FOR BENCHMARKING THIN FILM MEASUREMENT TOOLS

RELATED APPLICATION

The present application is based upon provisional patent application Ser. No. 60/128,937 filed on Apr. 13, 1999, and the entire disclosure of which is incorporated herein by reference.

FIELD OF THE INVENTION

The present invention relates to the field of semiconductor processing, and, more particularly, to a method for benchmarking measurement tools for measuring an insulation layer on a semiconductor substrate.

BACKGROUND OF THE INVENTION

In the manufacture of a metal oxide semiconductor (MOS) device, an insulation, i.e., a dielectric layer, is formed on a surface of the semiconductor substrate. This insulation layer may be silicon dioxide or silicon nitride, which is typically used as a gate dielectric for the MOS device. For purposes of quality control, the thickness of the insulation layer must be within a specified range. Unfortunately, once the insulation layer is exposed to an ambient environment, a contamination layer is formed on the insulation layer. This contamination layer grows over time to a predicted thickness based upon particles in the ambient environment, as well as the amount of humidity present in the ambient environment.

Measurement tools, such as an ellipsometer, can not distinguish between the insulation layer and the contamination layer because they have similar optical properties. Consequently, an actual thickness of the insulation layer may be within a specified range, yet the measured thickness exceeds this range because of the added thickness of the contamination layer. One approach to this problem is to measure the insulation layer before being exposed to the ambient environment causing the contamination layer to form thereon. However, this is not always practical in manufacturing environments due to limited availability of the measurement tools.

Another approach is to expose or age the insulation layer in the ambient environment so that the contamination layer forms to a predicted level. However, the thickness of the contamination layer may still adversely effect the overall measured thickness of the insulation layer, particularly if the thickness of the contamination layer causes the apparent thickness of the insulation layer to exceed the specified range.

Yet another problem arises in the benchmarking of different measurement tools due to the contamination layer. After the insulation layer has aged, the thickness of the insulation layer is measured using a first measurement tool at a first manufacturing site. Afterwords, the semiconductor substrate may be shipped to a second manufacturing site for further processing. The location of the first and second manufacturing sites may be at respective widely spaced geographic locations. However, a second measurement tool used to measure the same thickness of the insulation layer at the second manufacturing site may not provide the same measured thickness as did the first measurement tool.

This discrepancy in the measured thickness of the insulation layer using the second measurement tool may be caused by a change in the thickness of the contamination layer. That is, if the amount of particles in the ambient environment changes between different manufacturing sites, this is reflected by the thickness of the contamination layer either increasing or decreasing. In other words, the contamination layer may vary over time. In addition, this discrepancy may be caused by the second measurement tool being out of adjustment.

Therefore, there is a need to measure the actual thickness of the insulation layer and not a combined thickness of the insulation and contamination layers so that thin film measurement tools can be benchmarked.

SUMMARY OF THE INVENTION

An object of the present invention is to provide a method for calibrating thin film measurement tools that overcomes the above described measurement discrepancies associated with the contamination layer when measuring an insulation layer on a semiconductor substrate.

This and other objects, advantages and features in accordance with the present invention are provided by a method for calibrating thin film measurement tools comprising the steps of forming an insulation layer on a semiconductor substrate, and measuring a thickness of the insulation layer using a first measurement tool. The insulation layer is preferably exposed to an ambient environment causing a contamination layer to form thereon.

At least a portion of the contamination layer is removed by preferably heating the semiconductor substrate, and a combined thickness of the insulation layer and the contamination layer is then measured preferably using a second measurement tool. The steps of heating and measuring are preferably repeated until a measurement is obtained indicating that the contamination level has been removed. The measured value of the thickness of the insulation layer using the second measurement tool is then compared to the measured value of the thickness of the insulation layer using the first measurement tool to benchmark the first and second measurement tools.

Once the contamination layer has been removed, an accurate measurement of the insulation layer is performed. Since the first and second measurement tools are preferably at respective widely spaced geographic locations, the thickness of the contamination layer can vary between manufacturing sites due to a change in the amount of particles in the ambient environment, and to the amount of humidity in the ambient environment. Therefore, it is necessary to measure the actual thickness of the insulation layer so that the different measurement tools at the respective manufacturing sites can be benchmarked without being adversely effected by the contamination layer that normally forms on the surface of the insulation layer.

The method preferably further comprises, before the steps of measuring, exposing the insulation layer to an ambient environment causing a contamination layer to form on the insulation layer and heating the semiconductor substrate to remove at least a portion of the contamination layer. The steps of heating and measuring are preferably repeated until a measurement is obtained using the first measurement tool indicating that the contamination layer has been removed. In other words, if the contamination layer is formed at the first manufacturing site before the first measurement tool measures the thickness of the insulation layer, then the step of heating is performed to remove the contamination layer.

The step of heating is preferably performed using a rapid thermal annealing process. The temperature is preferably within a range of about 50 to 600 degree C., and the step of heating is preferably performed within a time period of about 1 second to 10 hours. The contamination layer is thus preferably removed during the step of heating without reoxidizing the insulation layer.

In another embodiment of the invention, the step of heating is performed at least one time for removing the contamination layer. This embodiment preferably includes measuring once a thickness of the insulation layer using the second measurement tool. In other words, the temperature and the time period in which the insulation layer is heated are selected so that the contamination layer is removed without having to repeat the steps of measuring.

DETAILED DESCRIPTION OF THE DRAWINGS

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
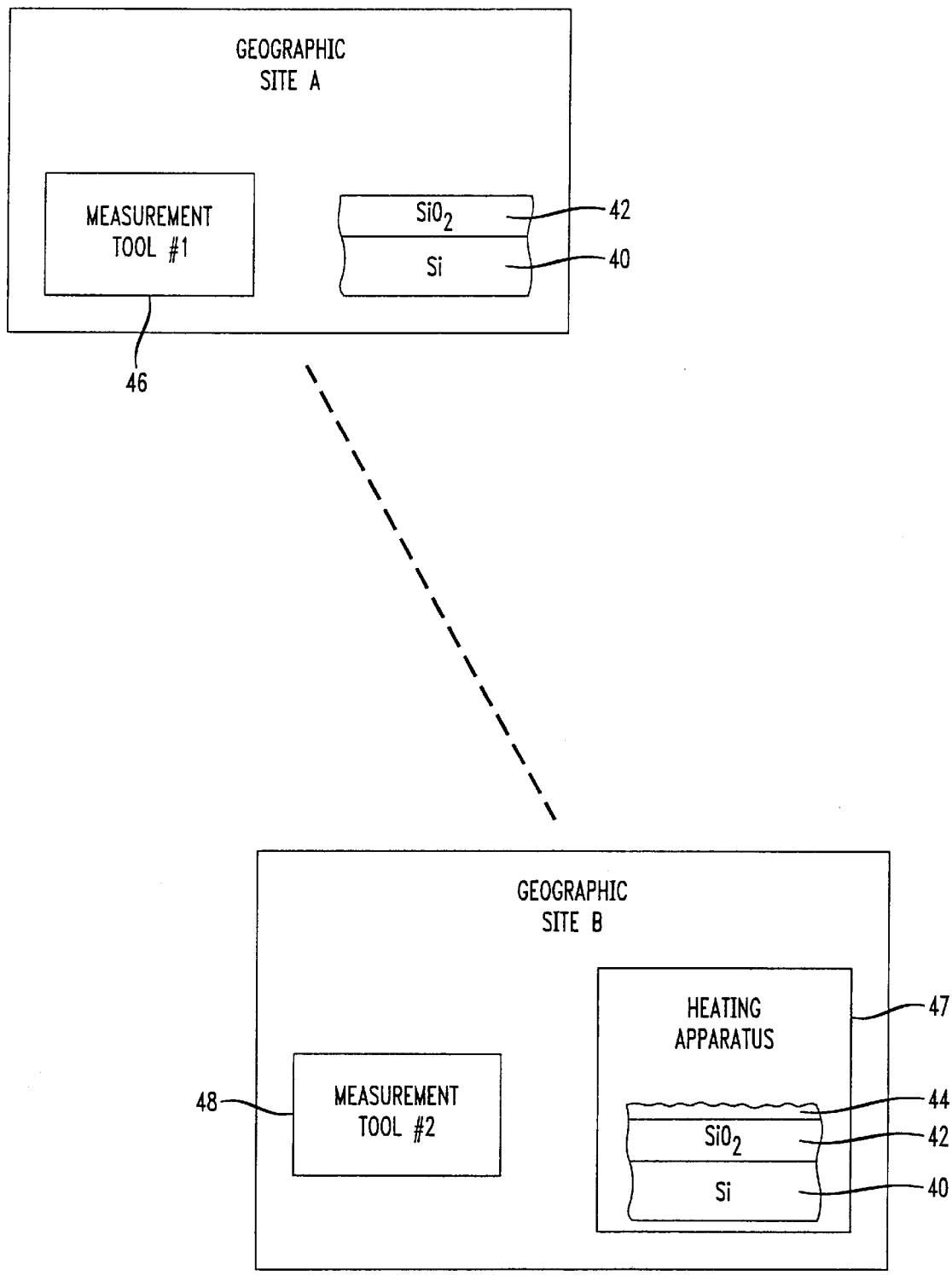
FIG. 1 is a schematic view of first and second thin film measurement tools for measuring the insulation layer on a semiconductor substrate at respective widely spaced geographic locations in accordance with the present invention.

A method for calibrating thin film measurement tools in accordance with the present invention will be described with reference to FIGS. 1–3. From the start (Block 20), a thin film comprising an insulation layer 42 having a thickness less than about 12 nm, and typically about 5 nm, is formed on a substrate 40 at block 22. The substrate 40 is a semiconductor substrate comprising silicon, or a silicon or polysilicon layer formed on the substrate. The insulation layer 42 is also referred to as a dielectric layer. The dielectric layer may be silicon dioxide or silicon nitride, which is typically used as a gate dielectric for MOS devices. The thickness of the insulation layer 42 is measured using a first measurement tool 46 at Block 24 and as best shown in FIG. 1. The first measurement tool 46 is at geographic site A, for example. For purposes of quality control, the thickness of the insulation layer 42 must be within a specified range.

The method further comprises the step of exposing the insulation layer 42 to an ambient environment causing a contamination layer 44 to form on the insulation layer at Block 26. The contamination layer 44 typically comprises hydrocarbons. Once exposed to the ambient environment, the surface of the insulation layer 42 adsorbs particles causing the contamination layer 44 to form over time to a thickness of about 0.2 to 0.4 nm. Exposing the insulation layer 42 may be caused by shipping the semiconductor substrate 40 with the insulation layer 42 thereon from geographic site A to geographic site B, which may be separated by a significantly large distance as indicated in FIG. 1.

Figure 2:
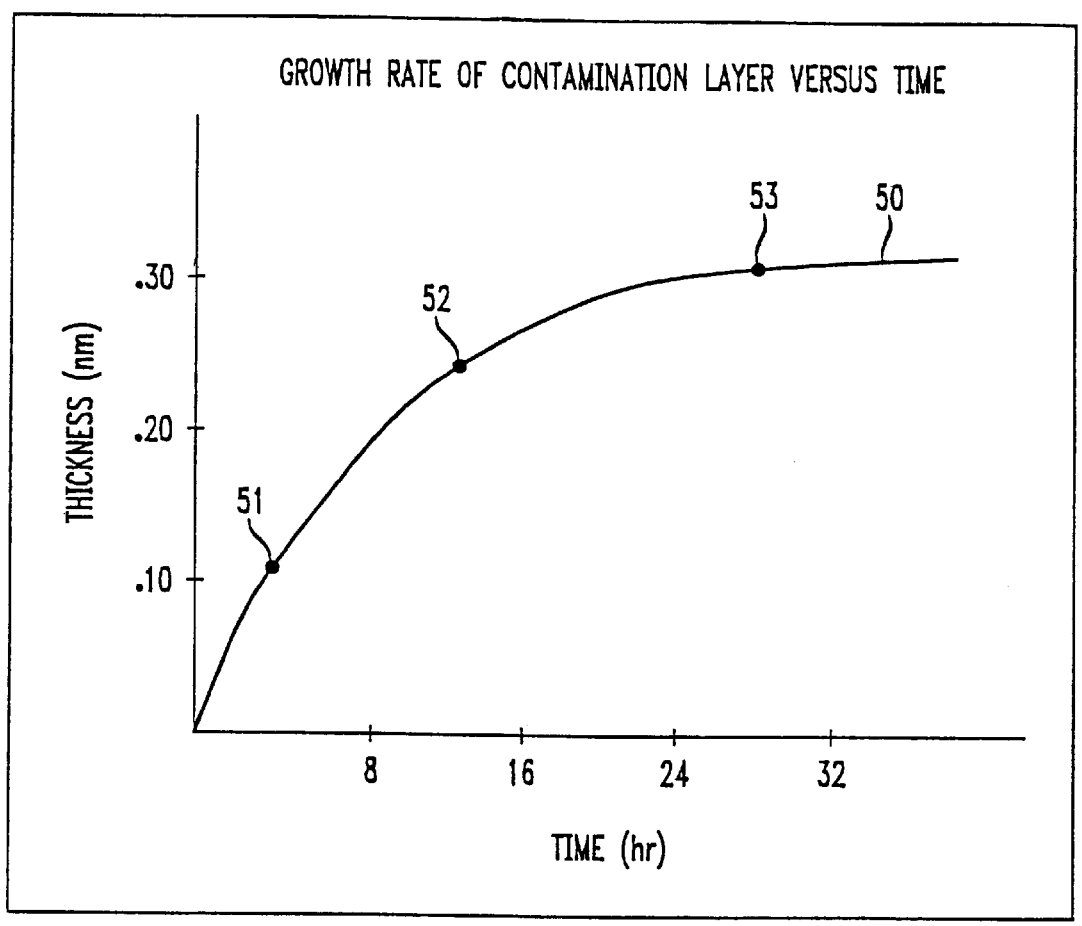
FIG. 2 is a graph of the growth rate of the contamination layer versus time in accordance with the prior art.
Figure 3:
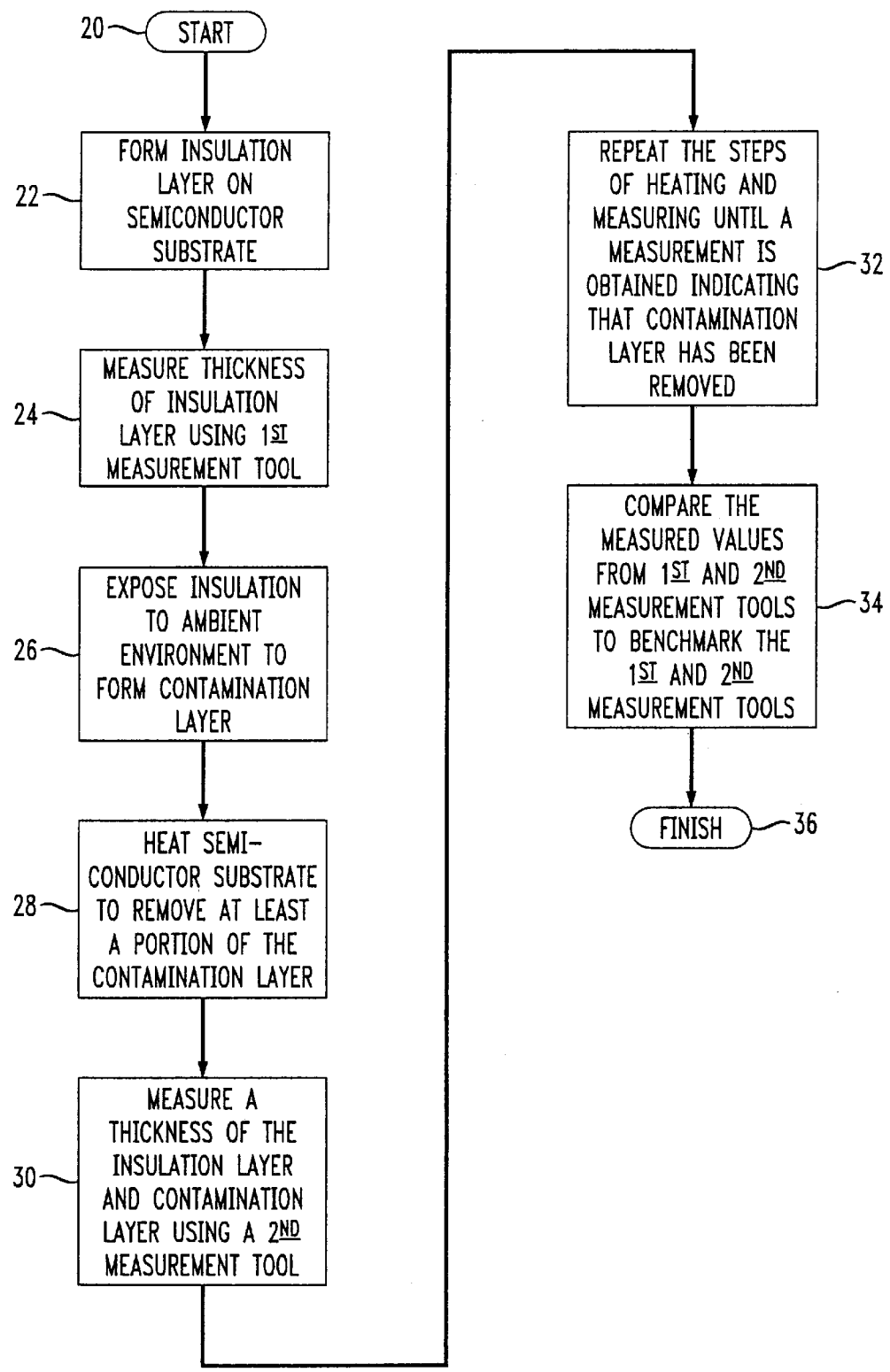
FIG. 3 is a flowchart illustrating the method for calibrating thin film measurement tools in accordance with the present invention.

The majority of the contamination layer 44 typically forms within the first day of being exposed to the ambient environment, as indicated by line 50 in FIG. 2. If the insulation layer 42 was measured at about 4 hours after having been exposed to the ambient environment, then the contamination layer 44 would be about 0.1 nm thick as indicated by reference 51. Similarly, if the measurement was performed at about 15 hours, the contamination layer would be about 0.23 nm thick as indicated by reference 52. After 24 hours, the contamination layer 44 has a thickness of about 0.3 nm as indicated by reference 53.

If the tolerance of the insulation layer 42 is 0.2 to 0.3 nm, a contamination layer 44 having a thickness of about 0.3 nm could cause the insulation layer to have an apparent thickness greater than the specified range. However, the predicted thickness and rate of formation of the contamination layer 44 depends on the particular ambient environment, as readily appreciated by one skilled in the art. For example, if the ambient environment contains a large amount of particles and is high in humidity, then the contamination layer 44 will likely form at a faster rate with an increased thickness.

After the insulation layer 42 has aged, the thickness of the contamination layer 44 reaches a predicted thickness, which is about 0.3 to 0.4 nm. Even after the insulation layer 42 has aged, the actual thickness of the contamination layer 44 can increase or decrease depending on the ambient environment.

A discrepancy in the measured thickness using different measurement tools may be caused by the change in thickness of the contamination layer 44 due to changes in the ambient environment between the different manufacturing sites as stated above. An ellipsometer is typically used to measure thin film thicknesses using a laser or broadband light source. Since the contamination layer 44 and the insulation layer 42 have similar optical characteristics, the two thickness are measured as one.

As discussed above, the problem arises when two different measurement tools 46, 48 provide conflicting measurement values so that it is difficult to determine if a measurement tool is out of calibration or the thickness of the contamination layer 44 has changed. Either way, the contamination layer 44 needs to be removed so that an accurate measurement of the insulation layer 42 can be made by each measurement tool. Then a comparison can be made between the two measured values for calibrating the two measurement tool 46, 48.

The method further includes the step of heating the semiconductor substrate 40 to remove at least a portion of the contamination layer 44 at Block 28. The semiconductor substrate 40 is heated in a heating apparatus 47 at geographic site B as best shown in FIG. 1. The heating is preferably a rapid thermal process which does not reoxidize the insulation layer 42. The temperature is within a range of about 50 to 600 degree C., for a time period within a range of about 1 second to 10 hours. For example, if the insulation layer 42 had a thickness of about 5 nm, then the step of heating may be performed at 200 degrees C. for 60 seconds in an inert ambient environment. The ambient environment in which the insulation layer 42 is heated may also comprise nitrogen inert gases or air.

The combined thickness of the insulation layer 42 and the contamination layer 44 is measured using a second measurement tool 48 at Block 30. The steps of heating (Block 28) and measuring (Block 30) are repeated until a measurement is obtained indicating that the contamination layer x has been removed, as indicated at Block 32.

In one embodiment, the heating and measuring steps at Blocks 30 and 32 are repeated about 3 to 5 times to insure that the contamination layer 44 has been removed. However, the contamination layer 44 can be removed in one heating and measuring step by adjusting the temperature and time period the insulation layer 42 is heated, as readily appreciated by one skilled in the art.

After performing at least one heating and measuring step for removing the contamination layer 44, the measured value of the thickness of the insulation layer 42 using the second measurement tool 48 is compared to the measured value of the thickness of the insulation layer using the first measurement tool 46 to benchmark the first and second measurement tools, as indicated at Block 34. The benchmarking is completed at Block 36.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for calibrating thin film measurement tools comprising the steps of:
    forming an insulation layer on a semiconductor substrate;
    measuring a thickness of the insulation layer using a first measurement tool;
    exposing the insulation layer to an ambient environment causing a contamination layer to form on the insulation layer;
    heating the semiconductor substrate to remove at least a portion of the contamination layer;
    measuring after heating a combined thickness of the insulation layer and the contamination layer using a second measurement tool;
    repeating the steps of heating and measuring until a measurement is obtained indicating that the contamination level has been removed; and
    comparing the measured value of the thickness of the insulation layer using the second measurement tool to the measured value of the thickness of the insulation layer using the first measurement tool to benchmark the first and second measurement tools.

2. A method according to claim 1, wherein the first and second measurement tools are at respective widely spaced geographic locations.

3. A method according to claim 1, wherein the step of heating is performed within a temperature range of about 50 to 600 degree C.

4. A method according to claim 1, wherein the step of heating is performed within a time period of about 1 second to 10 hours.

5. A method according to claim 1, wherein the step of heating is performed in an inert ambient environment.

6. A method according to claim 1, wherein the step of heating is performed in a nitrogen ambient environment.

7. A method according to claim 1, wherein the step of heating is a rapid thermal annealing process.

8. A method according to claim 1, wherein the insulation layer comprises at least one of silicon dioxide and silicon nitride.

9. A method according to claim 1, wherein the semiconductor substrate comprises silicon.

10. A method according to claim 1, before the step of measuring, the method further comprising the steps of:
    exposing the insulation layer to an ambient environment causing a contamination layer to form on the insulation layer; and
    heating the semiconductor substrate to remove at least a portion of the contamination layer before measuring the insulation layer using the first measurement tool;
    the method further comprising repeating the steps of heating and measuring until a measurement using the first measurement tool is obtained indicating that the contamination layer has been removed.

11. A method for calibrating thin film measurement tools comprising the steps of:
    forming an insulation layer on a semiconductor substrate;
    measuring a thickness of the insulation layer using a first measurement tool;
    exposing the insulation layer to an ambient environment causing a contamination layer to form on the insulation layer;
    heating the semiconductor substrate at least once to remove the contamination layer;
    measuring after heating a thickness of the insulation layer using a second measurement tool; and
    comparing the measured value of the thickness of the insulation layer using the second measurement tool to the measured value of the thickness of the insulation layer using the first measurement tool to benchmark the first and second measurement tools.

12. A method according to claim 11, wherein the first and second measurement tools are at respective widely spaced geographic locations.

13. A method according to claim 11, wherein the step of heating is performed within a temperature range of about 50 to 600 degree C.

14. A method according to claim 11, wherein the step of heating is performed with in a time period of about 1 second to 10 hours.

15. A method according to claim 11, wherein the step of heating is performed in an inert ambient environment.

16. A method according to claim 11, wherein the step of heating is performed in a nitrogen ambient environment.

17. A method according to claim 11, wherein the step of heating is a rapid thermal annealing process.

18. A method according to claim 11, wherein the insulation layer comprises at least one of silicon dioxide and silicon nitride.

19. A method according to claim 11, wherein the semiconductor substrate comprises silicon.

20. A method according to claim 11, before the step of measuring, the method further comprising the steps of:
    exposing the insulation layer to an ambient environment causing a contamination layer to form on the insulation layer; and
    heating the semiconductor substrate at least once to remove the contamination layer.

21. A method for calibrating thin film measurement tools comprising the steps of:
    forming an insulation layer on a semiconductor substrate;
    exposing the insulation layer to a first ambient environment causing a first contamination layer to form on the insulation layer;
    heating the semiconductor substrate at least once without reoxidizing the insulation layer to remove the first contamination layer;
    measuring a thickness of the insulation layer using a first measurement tool;
    exposing the insulation layer to a second ambient environment causing a second contamination layer to form on the insulation layer;

heating the semiconductor substrate at least once without reoxidizing the insulation layer to remove the second contamination layer;

measuring after heating a thickness of the insulation layer using a second measurement tool; and comparing the measured value of the thickness of the insulation layer using the second measurement tool to the measured value of the thickness of the insulation layer using the first measurement tool to benchmark the first and second measurement tools.

22. A method according to claim 21, wherein the first and second measurement tools are at respective widely spaced geographic locations.

23. A method according to claim 21, wherein the steps of heating are performed within a temperature range of about 50 to 600 degree C.

24. A method according to claim 21, wherein the steps of heating are performed with in a time period of about 1 second to 10 hours.

25. A method according to claim 21, wherein the steps of heating are performed in an inert ambient environment.

26. A method according to claim 21, wherein the steps of heating are performed in a nitrogen ambient environment.

27. A method according to claim 21, wherein the steps of heating are a rapid thermal annealing process.

28. A method according to claim 21, wherein the insulation layer comprises at least one of silicon dioxide and silicon nitride.

29. A method according to claim 21, wherein the semiconductor substrate comprises silicon.

* * * * *